(12) United States Patent
Horak et al.

(10) Patent No.: US 6,713,835 B1
(45) Date of Patent: Mar. 30, 2004

(54) METHOD FOR MANUFACTURING A MULTI-LEVEL INTERCONNECT STRUCTURE

(75) Inventors: David Vaclav Horak, Essex Junction, VT (US); Charles William Koburger, III, Essex Junction, VT (US); Peter H. Mitchell, Jericho, VT (US); Larry Alan Nesbit, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/443,709

(22) Filed: May 22, 2003

(51) Int. Cl.[7] ................ H01L 21/4763; H01L 23/48; H01L 29/00

(52) U.S. Cl. ............ 257/522; 257/758; 438/619; 438/622; 438/758

(58) Field of Search ................ 438/618, 619, 438/622, 687, 745; 257/522, 758

(56) References Cited

U.S. PATENT DOCUMENTS

| | | | | | |
|---|---|---|---|---|---|
| 5,117,276 A | * | 5/1992 | Thomas et al. | .............. | 257/758 |
| 5,444,015 A | * | 8/1995 | Aitken et al. | ................ | 438/619 |
| 5,798,559 A | * | 8/1998 | Bothra et al. | ................ | 257/522 |
| 6,245,658 B1 | * | 6/2001 | Buynoski | .................... | 438/619 |
| 6,255,712 B1 | * | 7/2001 | Clevenger et al. | .......... | 257/522 |
| 6,277,728 B1 | * | 8/2001 | Ahn et al. | .................. | 438/619 |
| 6,386,939 B1 | * | 5/2002 | Wu et al. | .................... | 446/218 |
| 6,403,461 B1 | * | 6/2002 | Tae et al. | .................... | 438/619 |
| 6,614,092 B2 | * | 9/2003 | Eldridge et al. | ............ | 257/522 |

* cited by examiner

Primary Examiner—T. N. Quach
(74) Attorney, Agent, or Firm—Wood, Herron & Evans, LLP

(57) ABSTRACT

A method for forming interlevel dielectric layers in multi-level interconnect structures using air as the constituent low-k dielectric material that is compatible with damascene processes without introducing additional process steps. The conductive features characteristic of the damascene process are formed by standard lithographic and etch processes in the mandrel material for each level of the interconnect structure. The conductive features in each level are surrounded by the mandrel material. After all levels of the interconnect structure are formed, a passageway is provided to the mandrel material. An isotropic etchant is introduced through the passageway that selectively etches and removes the mandrel material. The spaces formerly occupied by the mandrel material in the levels of the interconnect structure are filled by air, which operates as a low-k dielectric material.

39 Claims, 7 Drawing Sheets

METHOD FOR MANUFACTURING A MULTI-LEVEL INTERCONNECT STRUCTURE

FIELD OF THE INVENTION

The invention relates to the manufacture of integrated circuit chips and, more particularly, to a process for manufacturing multilevel interconnect structures for integrated circuit chips.

BACKGROUND OF THE INVENTION

Scaling down of active device dimensions in the manufacture of integrated circuits (IC) chips has improved circuit performance and increased complexity and the capability of the active devices packed on a semiconductor substrate. The full benefit of advances in active-device density may be realized only if the active devices are effectively interconnected. As the active device density increases and feature sizes shrink, the circuit performance and functional capability of an IC chip is eventually limited by the signal-transmission effectiveness and efficiency of the interconnect structure.

Multi-level interconnect structures have been developed that match the advances in active-device density by more effectively routing metallization lines between the active devices. In certain IC designs, five or more individual levels of metallization lines may be required to accommodate the active-device density. Multilevel interconnect structures arrange the metallization lines in multiple layers in which the metallization lines of each individual level are formed in an interlevel dielectric. The interlevel dielectric electrically isolates the metallization lines from one another in each level of the interconnect structure and electrically isolates metallization lines in adjacent levels.

Damascene processes are routinely used in back-end-of-line (BEOL) processing for fabricating multilevel interconnect structures. In a damascene process, trenches and vias are etched in a layer of an interlevel dielectric and filled with metal, such as copper (Cu) or a Cu-based alloy, to create metallization lines and vertical conductive paths between metallization lines in different levels. Copper has superior electromigration resistance and a lower resistivity than other candidate metals, such as aluminum, considered for in fabricating multilevel interconnect structures. Traditional subtractive etching approaches cannot be used to form copper metallization lines because copper is difficult to etch. Therefore, damascene processes are particularly meaningful for fabricating copper metallization lines.

In a dual-damascene process, the interlevel dielectric layer is conformally covered by a blanket of metal that simultaneously fills the trenches and vias. Excess overburden metal is removed from the interlayer dielectric by a process such as chemical-mechanical polishing (CMP). Metal remaining in the trenches extends substantially horizontal relative to the substrate to define metallization lines, and metal remaining in the vias provides contacts between metallization lines in adjacent levels. A single-damascene process forms trenches and vias in distinct interlevel dielectric layers and fills each with a distinct blanket deposition of metal.

As the active-device density increases and feature sizes shrink, the line-to-line spacings between adjacent, on-pitch metallization lines in individual layers and between metallization lines in adjacent layers of the multi-level interconnect structure are reduced. Shrinking the line-to-line spacings increases the line-to-line capacitance, which slows the speed of the signals carried by the metallization lines and results in propagation delay.

The line-to-line capacitance may be reduced by reducing the dielectric constant of the interlevel dielectric. To that end, one trend in multilevel interconnect structures is to form the interlevel dielectric from a dielectric material characterized by a relative permittivity or dielectric constant less than the dielectric constant of silicon oxide or fluorinated silicon glass. Generally, such low-k dielectrics are characterized by a dielectric constant less than about 4, which represents the dielectric constant of silicon oxide. Candidate low-k materials include spin-on low-k films, such as SILK commercially available from Dow Chemical Co. (Midland, Mich.), and chemical vapor deposition low-k films, such as organosilicates. The reduction in line-to-line capacitance afforded by low-k dielectrics permits adjacent metallization lines to be positioned closer together and decreases the number of levels in the multi-level interconnect structure. The effect of low-k dielectrics is to improve the performance of an IC chip for a given wiring density.

Damascene processes place stringent requirements on the properties of the material forming the interlevel dielectric layer and, hence, on the candidate low-k dielectrics projected for use as an interlevel dielectric. The host of requirements has limited the integration of low-k dielectrics into damascene processes for fabricating multilevel interconnect structures. In particular, low-k dielectrics must be compatible with the cleaning, etching, CMP and thermal treatments characteristic of a damascene process. The low-k dielectric must have sufficient mechanical strength and chemical stability to withstand all process steps.

In damascene processes, interlevel dielectric layers formed from a conventional low-k dielectric are covered by an etch stop layer as protection from photoresist stripping processes. The etch stop layer also serves as a hard mask for CMP processes that remove excess metal overburdening the interlevel dielectric after the blanket deposition that fills the vias and trenches. Conventional low-k dielectrics are soft and prone to undercutting when polished by a CMP process if the etch stop layer is omitted. Because many low-k dielectrics are hydrophilic, the etch stop layer also shields the interlevel dielectric from moisture introduced during the CMP processes and protects the interlevel dielectric from attack by aggressive post-CMP cleaning.

Although etch stop layers eliminate these adverse effects, their presence adds to the complexity of the damascene process. In particular, a distinct deposition is required to create each etch stop layer. Another disadvantage is that the most commonly used etch stop material, silicon nitride, has a rather high dielectric constant ranging between about 6 and about 8. Therefore, the presence of etch stop layers increases the effective dielectric constant and capacitance of the interlevel dielectric.

An extremely low-k dielectric for forming a multilevel interconnect structure is air, which has a dielectric constant of about unity. Mechanical strength is lent during processing by incorporating a sacrificial or removable material as a temporary interlevel dielectric and removing the sacrificial material after the levels of the multilevel interconnect structure are completed. The spaces formerly occupied by the sacrificial material are air-filled voids.

One conventional approach for forming an air dielectric uses amorphous carbon as a sacrificial material. The amorphous carbon is removed by providing passageways extending through the interconnect structure and heating in an oxidizing environment to convert the amorphous carbon to a carbonaceous gas that escapes through the passageways. However, two capping layers of silicon nitride are applied over the metallization lines of each interconnect level before the amorphous carbon is removed. Each capping layer requires a discrete lithographic patterning and etching step that adds fabrication costs and that may increase the IC chip size to account for overlay tolerances between the two capping layers. The removal of the amorphous carbon is recognized to deteriorate the material forming the metallization lines, which necessitates fully encapsulating the metallization lines with an adhesion promotion barrier layer. In addition, the sacrificial amorphous carbon is removed from each level of the interconnect structure before successive levels are formed, which adds significant complexity to the manufacture of multi-level interconnect structures.

Another conventional approach for forming an air dielectric uses a flowable oxide or hydrogen silicate glass as a sacrificial material. The sacrificial material is removed by a wet chemical etch after all levels of the multi-level interconnect structure are formed The interconnect levels are formed by a damascene via and substractive-etch metallization line process, not a single- or dual-damascene process. The substractive-etch process forming the metallization lines also defines the pathways among the different levels of the interconnect structure for subsequently removing the sacrificial material.

Yet another conventional approach for forming an air dielectric relies on silicon nitride as a sacrificial material. The metallization lines are formed by a subtractive process and coated with 100 nm to 200 nm of silicon oxide as a protective layer for the subsequent removal of the sacrificial material. After the different levels of the interconnect structure are formed, the sacrificial material is removed by a chemical etchant with a high etch selectively for nitride to oxide, such as phosphoric acid. The protective layer must be relatively thick as phosphoric acid etches silicon oxide at a slow but measurable rate. As metallization lines become more densely packed to match increases in active-device density, the proposed thickness of the protective layer needed to prevent etching of the metallization lines is comparable to the spacing between adjacent metallization lines. As a result, this conventional approach becomes unworkable for providing an air dielectric as the gap between on-pitch metallization lines decreases.

What is needed, therefore, is a method for forming interlevel dielectric layers in multilevel interconnect structures using air as the constituent low-k dielectric material that may be integrated with damascene processes without added process steps and that is compatible with material removal by chemical mechanical polishing in damascene processes.

SUMMARY OF THE INVENTION

The invention is directed to a method for manufacturing a multi-level interconnect structure. A mandrel material is applied to a substrate and portions of the mandrel material are removed to form trenches and vias, in which the trenches may open onto the underlying vias. The vias and the trenches are then filled with a conductive material, preferably simultaneously by a single deposition, to create a plurality of features. The mandrel material is disposed between adjacent features and at least one layer is formed overlying the features and mandrel material. One or more passageways are defined leading to the mandrel material through the layer and an isotropic etchant is introduced into each passageway. The isotropic etchant selectively etches the mandrel material to leave an air void between adjacent features. In certain embodiments of the invention, the mandrel material is selected from among amorphous silicon, amorphous germanium, and amorphous silicon-germanium. In other embodiments of the invention, additional levels of filled vias and trenches may be formed in separate layers of mandrel material applied before the overlying layer is formed and subsequently removed by the isotropic etchant.

In accordance with the principles of the invention, the use of the mandrel material as a sacrificial interlevel layer, which is removable after processing to leave behind air-filled spaces, overcomes the difficulties encountered with the integration of low-k dielectrics in damascene processes. In particular, the mandrel material does not require etch stop layers or other cap layers for protection and structural strength during CMP processes. The mandrel material is chemically resistant to etchants used during photoresist stripping and has a structural rigidity that opposes mechanical pressure applied during CMP processes. The elimination of such etch stop layers from the multilevel interconnect structure lowers the effective dielectric constant of the interconnect structure.

The mandrel material is fully compatible with single or dual damascene processes as the vias and trenches are may be formed by standard lithographic and etch techniques in the mandrel material. As a result, no additional process steps are required to integrate the principles of the invention into a damascene process. Moreover, the mandrel material is sufficiently rigid that additional process steps are not required to form structural reinforcement, such as support pillars. Such structural reinforcement may also increase the effective dielectric constant. Implementing the principles of the invention adds little or no additional cost to a damascene process and does not necessitate any additional lithographic steps that could otherwise increase chip size to account for mask overlay tolerances needed to accomplish pattern alignment.

The mandrel material is removable selective to copper metal and conventional liners filling the vias and trenches of multilevel interconnect structures formed with damascene processes without etch stop layers. The mandrel material is also removed selective to other exposed materials in the multilevel interconnect structure including, but not limited to, silicon oxide, silicon nitride, and aluminum. Therefore, the removal of the mandrel material to leave behind air-filled interlevel dielectric layers does not compromise or degrade the residual metallization or other materials present in the interconnect structure.

The dielectric properties of the mandrel material are not relevant to the invention, nor to the completed IC chip, because the mandrel material is removed from the back-end-of-line (BEOL) before the fabrication of the IC chip is complete.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

The invention is directed to manufacturing a multi-layer interconnect structure for an integrated circuit having air as the interlevel dielectric between individual levels of metallization. According to the principles of the invention, a sacrificial mandrel material replaces the interlevel dielectric during the fabrication of the interconnect structure and, after fabrication, is removed and the empty spaces are filled with air. As a consequence of the inventive methodology, high-quality, multi-level interconnect structures can be readily and cost-effectively fabricated utilizing processing methodologies and instrumentalities characteristic of damascene processes.

Figure 1:
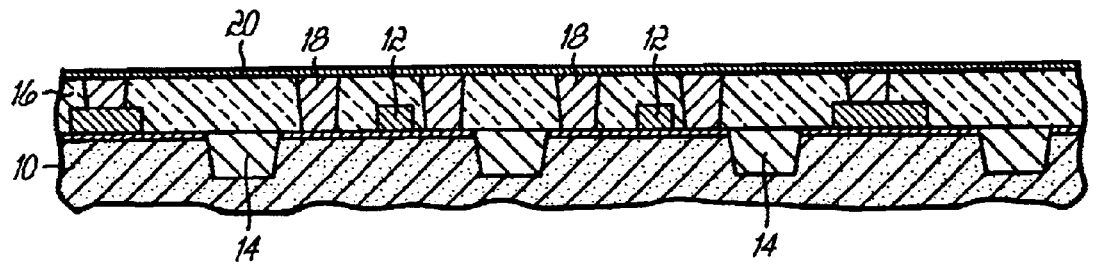
FIGS. 1–19 are cross-sectional views of a portion of a substrate at various stages of an embodiment of a damascene processing method in accordance with principles of the invention.

With reference to FIG. 1, a portion of a substrate 10 includes regions such as gate conductors 12 of field effect transistors (FET's) and shallow trench isolation (STI) structures 14. Substrate 10 may be any suitable semiconductor substrate material, including but not limited to silicon and gallium arsenide, upon which or within which active devices may be formed by front-end-of-line (FEOL) processes. An insulating layer 16 constituted by a material of relatively high electrical resistivity, such as borophosphosilicate glass (BPSG), is deposited on the substrate 10 as a pre-metal dielectric. The exposed surface of the insulating layer 16 is polished flat and planarized by a chemical-mechanical polishing (CMP) process or any other suitable planarization technique. Generally, CMP processes involve a polishing or mechanical abrasion action aided chemically by a slurry introduced between a polishing pad and the substrate 10.

Contacts 18 are provided by forming contact openings in the insulating layer 16 by a standard lithographic and etch process, introducing a conductive material, such as tungsten, by a blanket deposition that fills the contact openings, and removing the excess overburden of conductive material down to the insulating,layer.16 by any suitable planarization technique, such as a CMP process. An etch stop layer 20, typically ranging from about 10 nm to about 50 nm in thickness, is then formed on the polished surface. The etch stop layer 20 may be composed of any of a number of different materials, such as silicon nitride or silicon oxide, deposited by conventional physical vapor deposition or chemical vapor deposition techniques.

Figure 2:
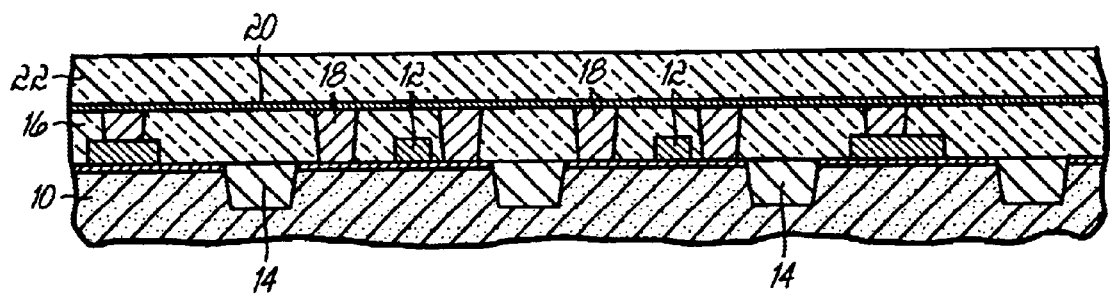

With reference to FIG. 2, a mandrel layer 22 is deposited on the etch stop layer 20. As will be discussed below, the mandrel layer 22 represents material that is removed by a subsequent processing step. Generally, the mandrel layer 22 has a thickness in the range of approximately 100 nm to approximately 1000 nm. The. mandrel layer 22 may be deposited by any conventional deposition technique, including but not limited to chemical vapor deposition and physical vapor deposition, compatible with depositing the material forming layer 22.

Figure 3:
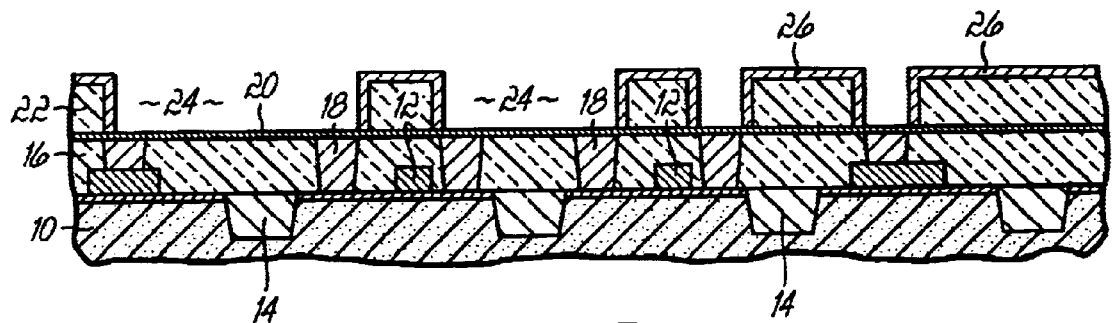

With reference to FIG. 3, a plurality of trenches 24 are defined in the mandrel layer 22 that extend vertically to the horizontal level of the etch stop layer 20. Trenches 24 may be formed using a single conventional lithographic and etch operation in which a resist layer (not shown) is applied to the mandrel layer 22, exposed to impart a latent image pattern characteristic of the trenches 24, and developed to transform the latent image pattern into a final image pattern that defines masked areas and unmasked areas on mandrel layer 22 at the locations of the trenches 24, and portions of mandrel layer 22 are removed in unmasked areas by any suitable etching process, such as anisotropic etching (e.g. plasma etching or reactive ion etching), that produces vertical trench sidewalls, down to the etch stop layer 20 to define the trenches 24. The patterned resist is stripped after trenches 24 are formed.

The term "horizontal" as used herein is defined as a plane parallel to the conventional plane or surface of substrate 10, regardless of orientation. The term "vertical" refers to a direction perpendicular to the horizontal, as just defined. Terms, such as "on", "above", "below", "side" (as in "sidewall"), "higher", "lower", "over", and "under", are defined with respect to the horizontal plane.

After the trenches 24 have been defined, the exposed surfaces of the mandrel layer 22 may be optionally covered by a thin oxide layer 26 grown, for example, by low temperature plasma oxidation. A typical thickness for oxide layer 26, which may be silicon oxide, is about 10 nm to about 50 nm.

Figure 4:
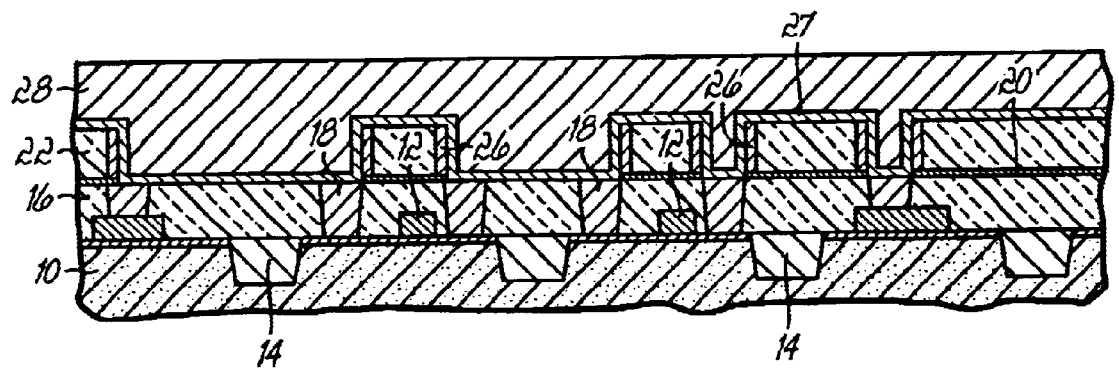

With reference to FIG. 4, areas of the etch stop layer 20 exposed by the definition of trenches 24 are removed by etching, such as by plasma or reactive ion etching, to permit the establishment of electrical contact with the contacts 18. Areas of the oxide layer 26, if present, on the horizontal surfaces of the mandrel layer 22 are also removed by wet or dry etching. An adhesion-promoting barrier liner 27 is then applied to the horizontal and vertical surfaces of the trenches 24. Typical materials suitable for liner 27 include titanium, titanium nitride, tantalum, tantalum nitride, other refractory metals, metal nitrides, and combinations of the same. A seed layer (not shown) may be applied over the liner 27 to promote subsequent electrodeposition of a conductive material, such as copper or a copper alloy.

Next, a conductive layer 28 of a metal, such as copper or a copper alloy, is blanket deposited conformally on substrate 10 by a suitable deposition technique, such as by plating with electroless or electroplating techniques. Alternatively, the conductive layer 28 may be deposited by a physical vapor deposition or chemical vapor deposition. After the blanket deposition of the conductive layer 28, metal fills the trenches 24 and overburdens the patterned remnants of mandrel layer 22. If necessary, the substrate 10 may be heat treated to anneal the metal of conductive layer 28 before subsequent process steps. In particular, annealing copper increases the grain size to improve electromigration reliability and promote bonding with liner 27.

Figure 5:
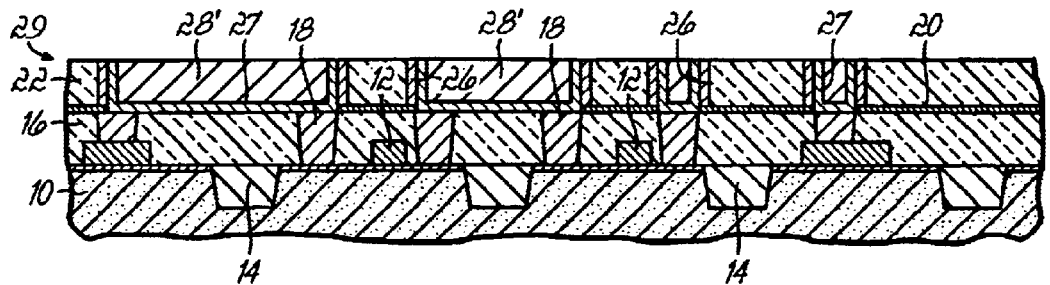

With reference to FIG. 5, excess metal from conductive layer 28, portions of the liner 27 present on the mandrel layer 22, and portions of any oxide layer 26 present on the mandrel layer 22 are removed by any suitable planarization technique, such as a CMP process, stopping at the horizontal level of the trenches 24 to provide a planarized surface. The inlaid metal originating from conductive layer 28 that fills the trenches 24 defines conductive features 28' surrounded by the material of mandrel layer 22. The mandrel layer 22 serves as a polishing stop layer for CMP processes. The resulting structure defines a first level, generally indicated by reference numeral 29, of the multilevel interconnect structure.

Figure 6:
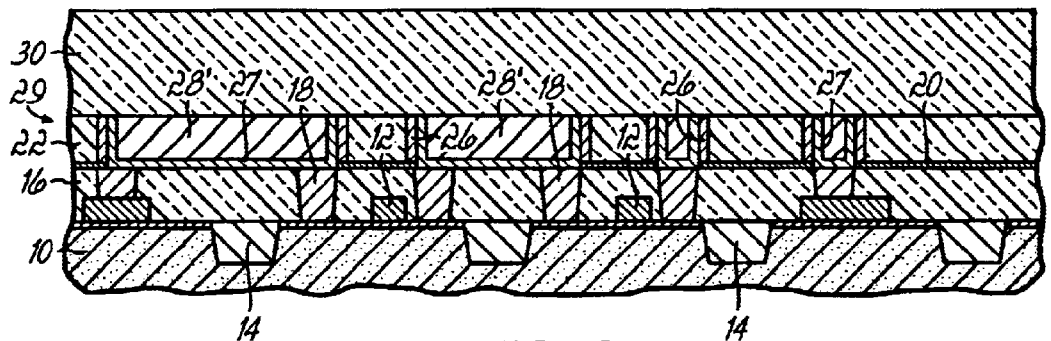

With reference to FIG. 6, another mandrel layer 30 is deposited on the planarized surface. A typical thickness for the mandrel layer 30 is between about 100 nm and about 1500 nm, preferably about 1000 nm. The mandrel layer 30 may be deposited by any conventional deposition technique, including, but not limited to, chemical vapor deposition and physical vapor deposition, compatible with depositing the material forming layer 30.

Figure 7:
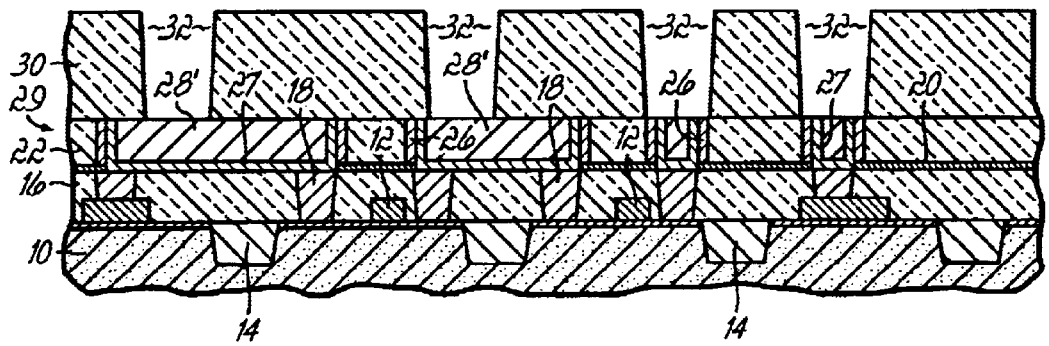

With reference to FIG. 7, a plurality of vias 32 are defined in the mandrel layer 30 using a single conventional lithographic and etch operation. Specifically, a resist layer (not shown) is applied to the mandrel layer 30, exposed to impart a latent image pattern characteristic of the vias 32, developed to transform the latent image pattern into a final image pattern that defines masked areas and unmasked areas on mandrel layer 30 at the locations of the vias 32, and subsequently etched by any suitable etching process, such as anisotropic etching (e.g. plasma etching or reactive ion etching), that produces vertical via sidewalls, to remove material from mandrel layer 30 in unmasked areas and form vias 32. Vias 32 extend vertically through the mandrel layer 30 down to conductive lines 28' for establishing electrical interconnections. After vias 32 are defined, the patterned resist layer is stripped.

Figure 8:
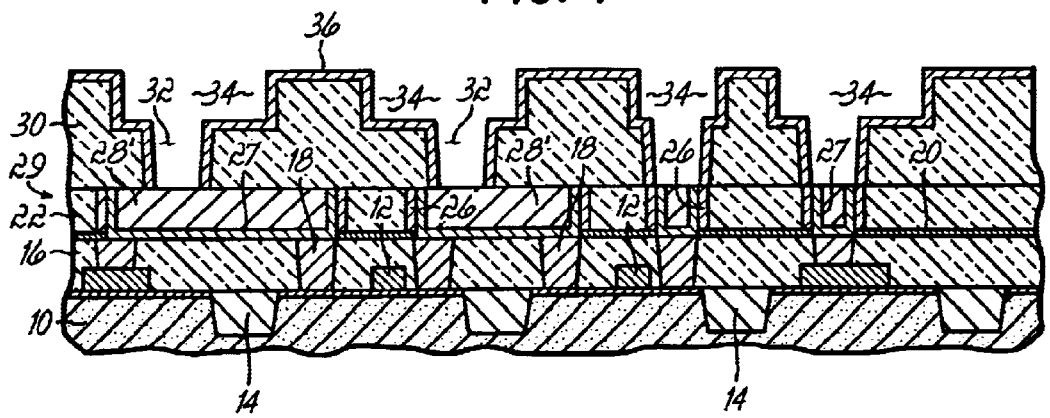

With reference to FIG. 8, a plurality of trenches 34 is provided in the mandrel layer 30 using a single conventional lithographic and etch operation. Specifically, a resist layer (not shown) is applied to the mandrel layer 30, exposed to impart a latent image pattern characteristic of the trenches 34, developed to transform the latent image pattern into a final image pattern that defines masked areas and unmasked areas on the mandrel layer 30 at the locations of trenches 34, and subsequently etched by any suitable etching process, such as anisotropic etching (e.g. plasma etching or reactive ion etching), that produces substantially vertical trench sidewalls, to remove material from mandrel layer 30 in unmasked areas and form trenches 34. After trenches 34 are defined, the patterned resist is stripped. The trenches 34 are formed in alignment with the vias 32 so as to generally have an overlying relationship. The exposed horizontal, and vertical surfaces of the mandrel layer 30 may be optionally covered by a thin oxide layer 36, which may be silicon oxide grown, for example, by low temperature plasma oxidation.

The invention contemplates that vias 32 may be formed after trenches 34, rather than before trenches 34, without departing from the spirit and scope of the invention. The ability to perform these damascene process steps in either order is familiar to persons of ordinary skill in the art of semiconductor device fabrication.

Figure 9:
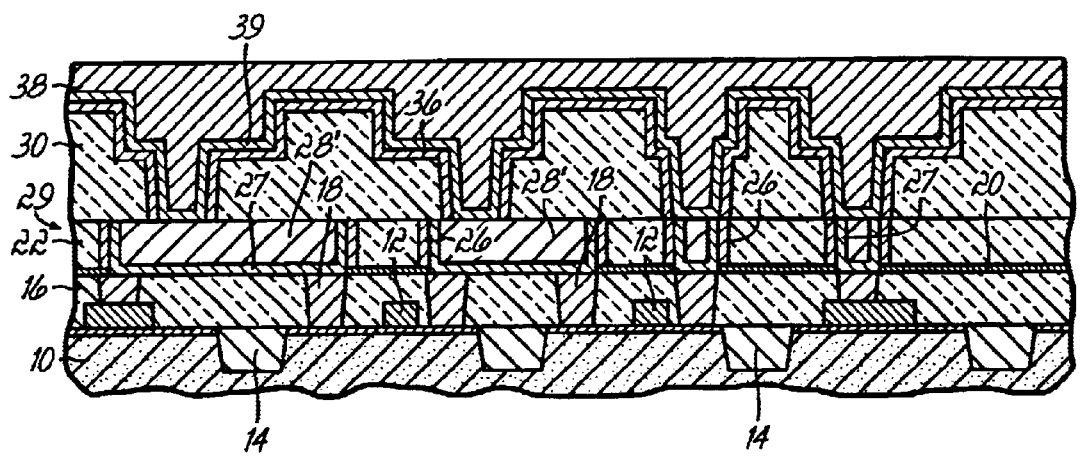

With reference to FIG. 9, an adhesion-promoting barrier liner 39 is applied to the horizontal and vertical surfaces of the vias 32 and trenches 34. Typical materials suitable for liner 39 include titanium, titanium nitride, tantalum, tantalum nitride, other refractory metals, metal nitrides, and combinations of the same. A seed layer (not shown) may be applied over the liner 39 to promote subsequent deposition of a conductive material, such as copper or a copper alloy, if deposited by electroplating. Next, a conductive layer 38 of a metal, such as copper (Cu) or a copper alloy, is blanket deposited over the mandrel layer 30. The metal of conductive layer 39 fills vias 32 and trenches 34 and overburdens the patterned remnants of mandrel layer 30. If necessary, the substrate 10 may be heat treated to anneal the metal of conductive layer 38 before subsequent process steps. In particular, annealing copper increases the grain size to improve electromigration reliability and promote bonding with liner 39.

Figure 10:
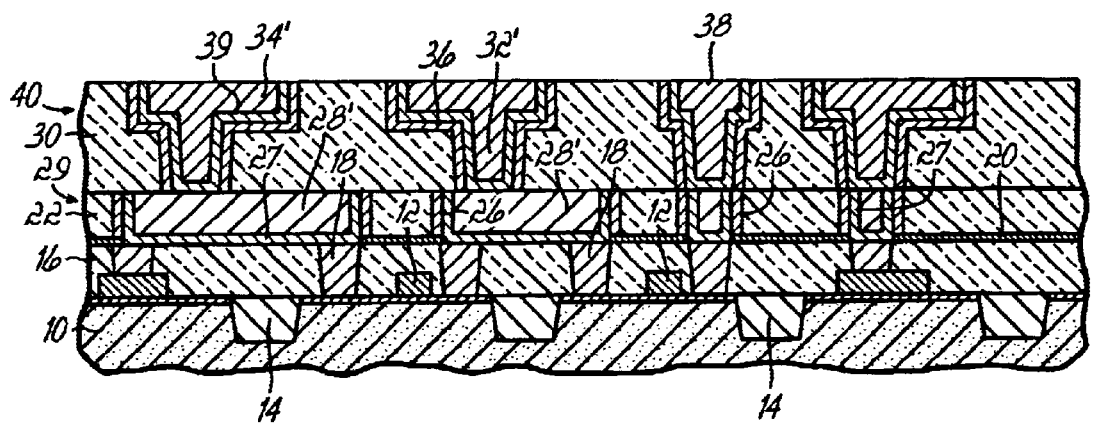

With reference to FIG. 10, excess metal in conductive layer 38, portions of the liner 39, and portions of any oxide layer 36 on the mandrel layer 30 that project above the upper horizontal level of trenches 34 are removed by any suitable planarization technique, such as a CMP process, to provide a planarized surface. The mandrel layer 30 acts as a polishing stop layer. The inlaid metal within the trenches 34 defines conductive lines 34' surrounded by the material of mandrel layer 30 and the inlaid metal within the vias 32 defines conductive plugs 32'.

The resulting structure defines a second level, generally indicated by reference numeral 40, of the multilevel interconnect structure. The conductive plugs 32' filling vias 32 and the conductive lines 34' filling trenches 34 interconnect active devices and other similar conductive lines in other levels of the interconnect structure. In particular, each of the conductive plugs 32' is in electrical contact at its lower end with one of the conductive features 28' and in electrical contact at its upper end with one of the conductive lines 34'.

Figure 11:
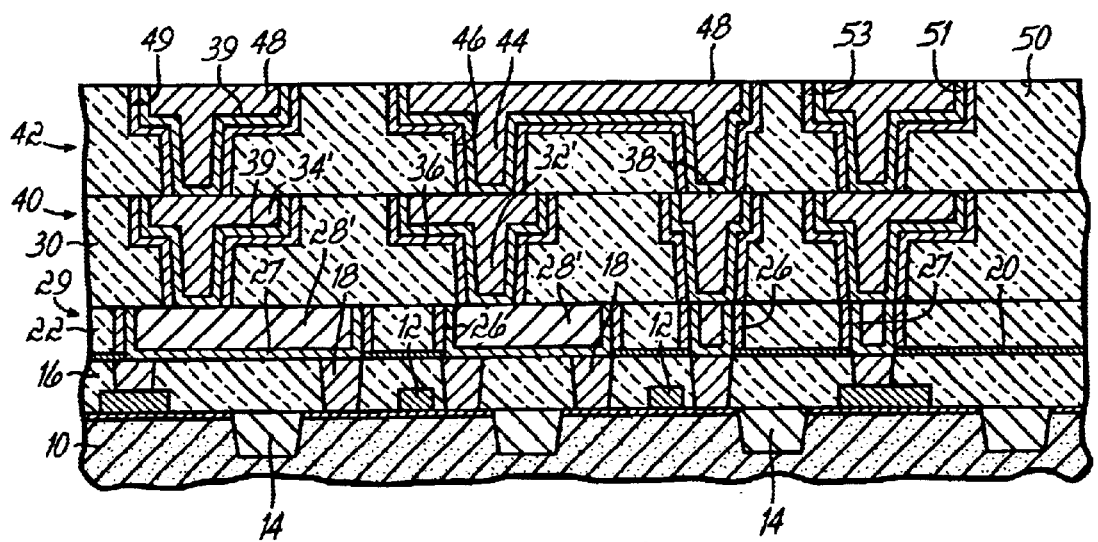

With reference to FIG. 11, the sequence of FIGS. 6–10 is repeated to fabricate additional levels of the multilevel interconnect structure. For example, a third interconnect level, generally indicated by reference numeral 42, is added to the structure of FIG. 11. The third interconnect level 42 includes a mandrel layer 50 surrounding conductive plugs 44 defined by metal filling vias 46 in mandrel layer 50, conductive lines 48 defined by metal filling trenches 49 in mandrel layer 50, a liner 51 for the conductive plugs 44 and conductive lines 48, and an optional oxide layer 53.

Although FIG. 11 illustrates the multilevel interconnect structure as having three individual levels 29, 40, 42, the invention is not so limited as additional levels similar to levels 40 and 42 may be added to multilevel interconnect structure as mandated by the IC chip design and active device density. The invention contemplates a hybrid integration for principles of the invention that incorporates air as an interlevel dielectric at upper levels of the multilevel interconnect structure and relies on a conventional low-k dielectric material, such as a spin-on low-k film or a chemical vapor deposition low-k film, as an interlevel dielectric in lower levels vertically below the levels from which the mandrel material is removed.

The mandrel layers 22, 30 and 50 are formed from any material capable of being removed by an isotropic etch process, such as a wet chemical etch process or a gaseous chemical etch process, selective to the other materials in the completed multi-level interconnect structure. Specifically, the isotropic etchprocess should be selective to the metal filling the vias and trenches of the damascene structure, the liner imposed between the mandrel layer and the metal, and any other materials, including but not limited to silicon oxide and silicon nitride, of the multilevel interconnect structure exposed to the etch process. In particular, the material forming the mandrel layers 22, 30 and 50 is removable selective to the metal and liner filling the vias and trenches so that a protective barrier layer is not required.

The material forming the mandrel layers 22, 30 and 50 should also have a hardness sufficient to operate as a polish stop for CMP processing of the metal deposited on the patterned mandrel layers 22, 30 and 50 to fill the vias and trenches with metal to form conductive plugs and conductive lines. In particular, the material forming the mandrel layers 22, 30 and 50 should be as hard and, preferably, harder to polish than the metal filling the vias and trenches of the damascene structure.

The material constituting mandrel layers 22, 30 and 50 should also not be dissolved, attacked or otherwise adversely affected by the slurry used during CMP process that planarizes the conductive material filling the vias and trenches or by reagents used in the clean operations following the CMP. For example, conventional CMP processes for polishing copper may use a slurry consisting of either hydrogen peroxide and alumina, ammonium hydroxide and alumina, or nitric acid and alumina, to which the material forming the mandrel layers 22, 30 and 50 should be resistant if copper metallization, as is preferred, is utilized in the multilevel interconnect structure.

Preferred candidate materials for mandrel layers 22, 30 and 50 are amorphous silicon, amorphous germanium and amorphous silicon germanium. Amorphous silicon is etchable in an isotropic etchant consisting of a solution of potassium hydroxide, which etches the mandrel layers 22, 30, and 50 selective to copper, the copper liner, and other common exposed materials on the substrate, such as silicon oxide, silicon nitride, and titanium. Amorphous silicon is conventionally produced by thermal chemical vapor deposition (CVD) using a silicon-yielding precursor, such as silane ($SiH_4$), as a reactant gas, by low pressure chemical vapor deposition (LPCVD) using a silicon-yielding precursor as a reactant gas, by plasma-enhanced chemical vapor deposition (PECVD) using a silicon-yielding precursor as a reactant gas, or by techniques of physical vapor deposition (PVD). Amorphous germanium, which is isotropically etchable in a solution containing hydrogen peroxide, may be formed by similar CVD methods using a germanium-yielding precursor, such as germane ($GeH_4$), as a reactant gas or by a PVD technique. Amorphous silicon germanium may be deposited by a CVD process using a reactant gas mixture, such as germane and silane, or by PVD using a target material of a suitable composition.

Figure 12:
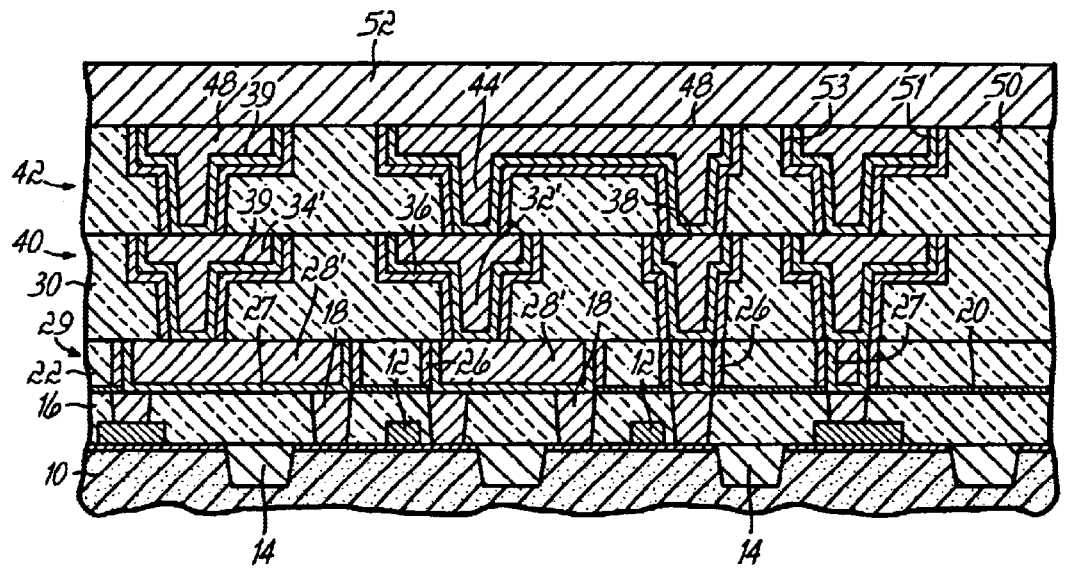
Figure 13:
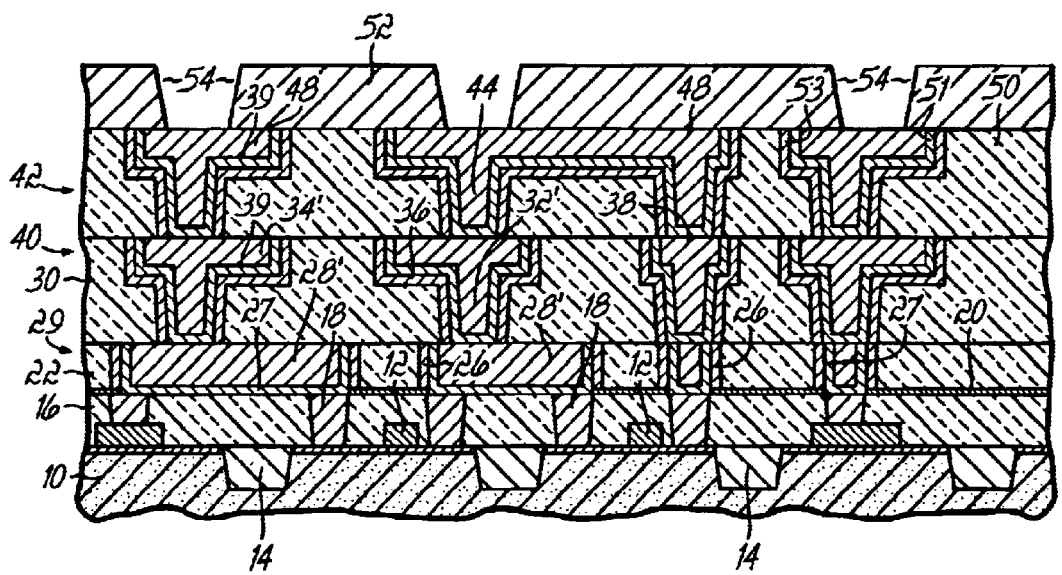

With reference to FIGS. 12 and 13, an insulating layer 52 of, for example, silicon oxide, silicon nitride or a combination of these two materials, is deposited on the planarized surface of the uppermost level 42 of the multilevel interconnect structure. A plurality of vias 54 are formed in the insulating layer 52 using conventional lithographic and etch techniques. Specifically, a resist layer (not shown) is applied to the insulating layer 52, exposed to impart a latent image pattern characteristic of the vias 54, developed to transform the latent image pattern into a final image pattern that defines masked areas and unmasked areas on insulating layer 52 at the locations of the vias 54, and subsequently etched by any suitable etching process, such as anisotropic etching (e.g. plasma etching or reactive ion etching), that produces tapered via sidewalls, to remove material from insulating layer 52 in unmasked areas and form vias 54. The vias 54 extend vertically to the horizontal plane of conductive linies 48.

Figure 14:
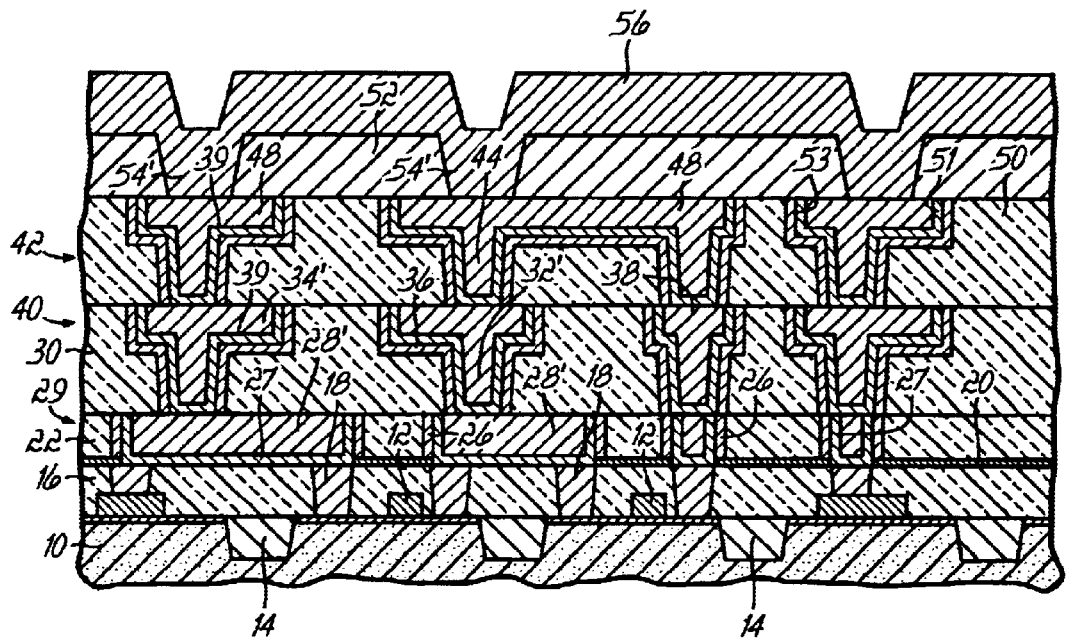
Figure 15:
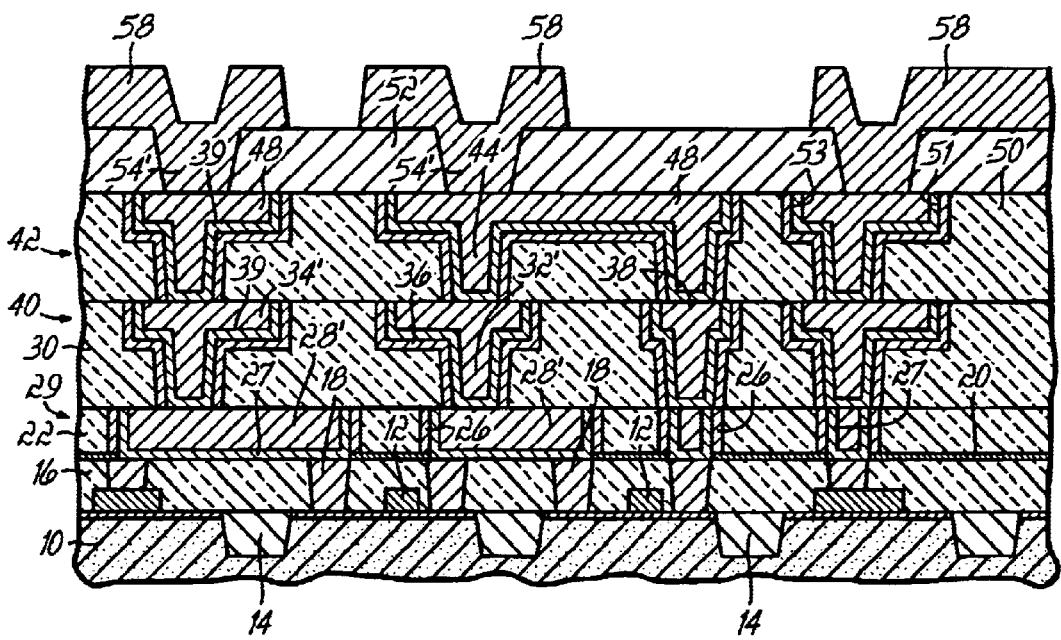

With reference to FIGS. 14 and 15, a conductive layer 56 is blanket deposited on the insulating layer 52. The conductive layer 56 is formed of a metal having a relatively high electrical conductivity, such as aluminum or an aluminum-based alloy. The metal filling vias 54 define conductive-plugs 54'. Conductive layer 56 is patterned using conventional subtractive lithographic and etch techniques to form conductive wiring lines 58. The conductive wiring lines 58 overlay the conductive plugs 54', so that the vias 54 remain metal-filled.

Figure 16:
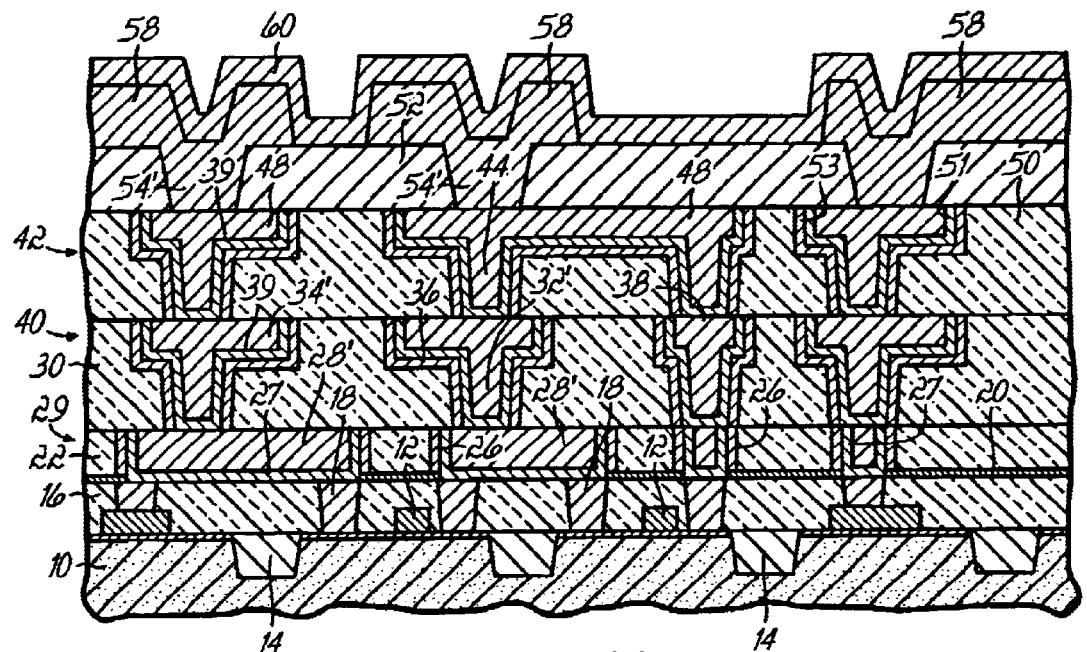
Figure 17:
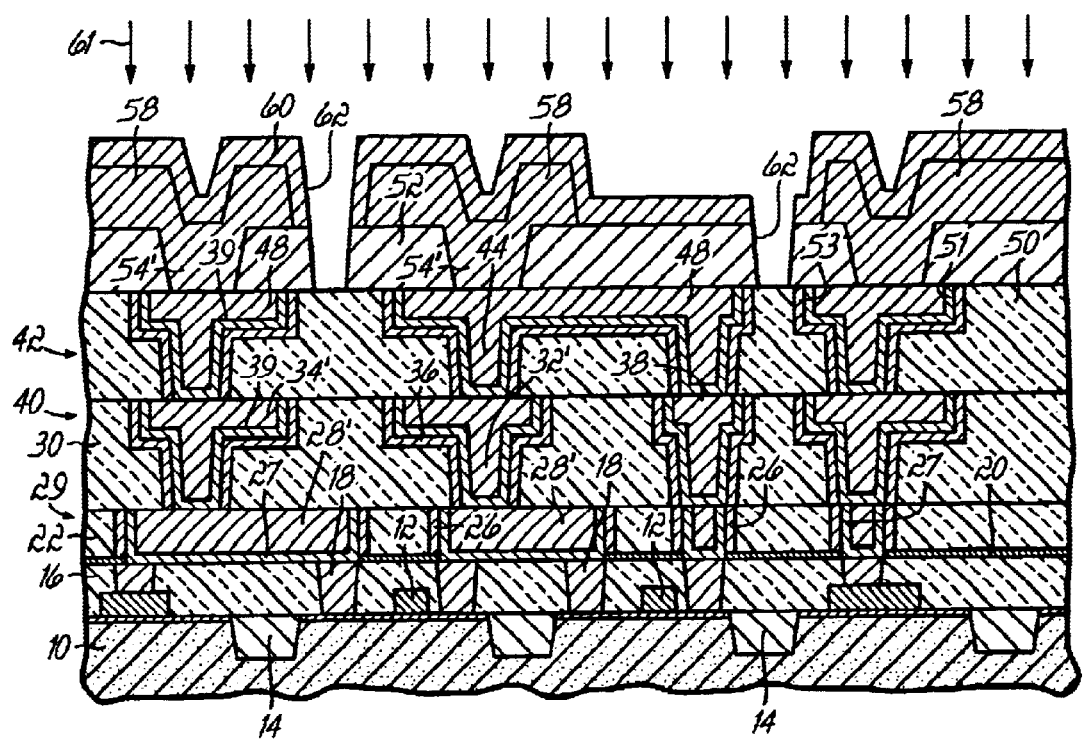

With reference to FIGS. 16 and 17, the wiring lines 58 are passivated by depositing an insulating layer 60 constituted by one or more dielectric materials, such as silicon oxide or silicon nitride. At least one and, preferably, a plurality of passageways 62 are defined in the insulating layer 52 and the insulating layer 60 by conventional lithographic and etch techniques at locations. Specifically, a resist layer (not shown) is applied to the insulating layer 60, exposed to impart a latent image pattern characteristic of the passageways 62, developed to transform the latent image pattern into a final image pattern that defines masked areas and unmasked areas on insulating layer 60 at the locations of the passageways 62, and subsequently etched by any suitable etching process, such as anisotropic etching (e.g. plasma etching or reactive ion etching), that produces substantially vertical via sidewalls, to remove material from insulating layer 52 and insulating layer 60 in unmasked areas and form passageways 62. Each of the passageways 62 is located between the conductive plugs 54' and wiring lines 58. The passageways 62 extend through the insulating layer 52 and the insulating layer 60, but not through the metal originally associated with conductive layer 56. The passageways 62 extend toward the substrate 10 to define unobstructed discrete liquid pathways that permit fluid access to the mandrel layers 22, 30, and 50.

An isotropic etchant, generally indicated by reference numeral 61, is introduced into the passageways 62 for removing the mandrel layers 22, 30, and 50. The isotropic etchant 61 may be introduced by either a wet chemical process or a gaseous chemical process. Typically, isotropic etchant 61 is applied over the entire substrate 10, such as immersing the substrate 10 in a liquid chemical bath containing isotropic etchant 61. The isotropic etchant 61 etches the material forming the mandrel layers 22, 30 and 50, preferably equally in all directions at the same rate. The immersion of the substrate 10 is sustained until the mandrel layers 22, 30 and 50 are removed.

Figure 18:
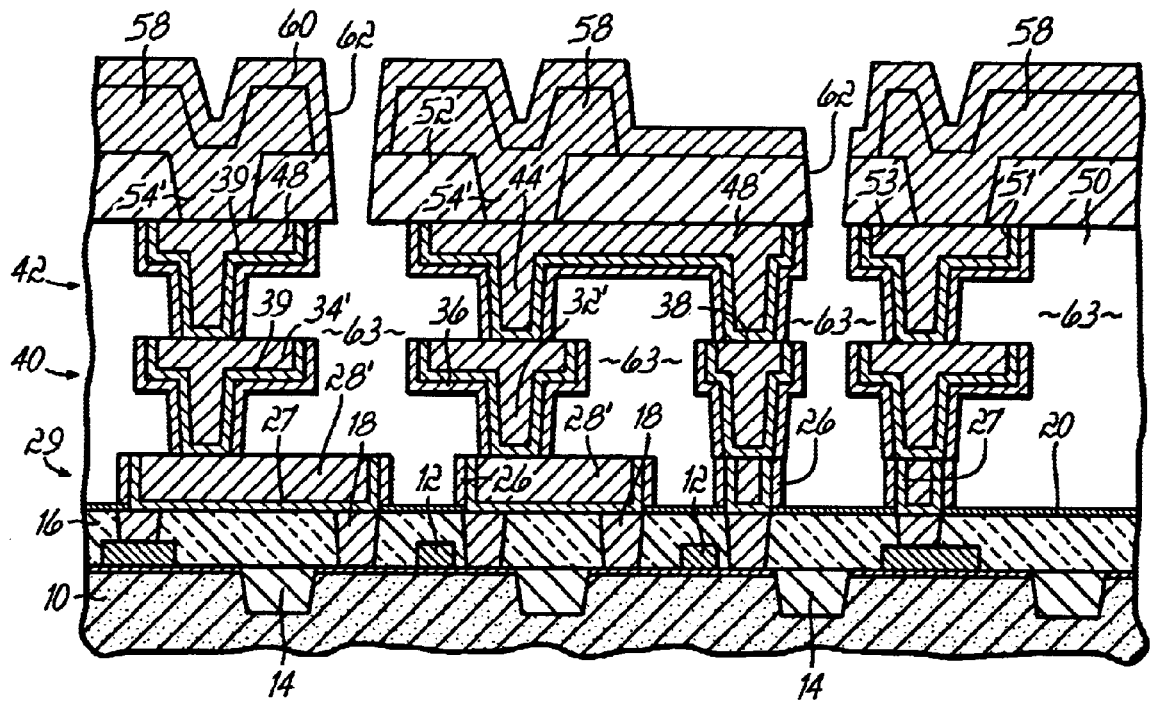

With reference to FIG. 18, the chemical action of the isotropic etchant 61 (FIG. 17) dissolves and removes the material forming the mandrel layers 22,30, and 50, while the materials forming barrier layer 20, oxide layers 26 and 36, liners 27, 39 and 51, conductive layers 28, 38, and 56, insulating layer 52, and insulating layer 60, are not significantly modified. The byproducts from the etched mandrel material exit the interconnect structure by diffusion mediated by isotropic etchant 61 through the passageways 62. Air voids 63 define a volumetric space formerly occupied by the material of mandrel layers 22, 30, and 50 and now filled by air having a dielectric constant of about unity. The air voids 63 electrically isolate conductive features 28', conductive plugs 32', conductive lines 34', conductive plugs 44, and conductive lines 48 from among one another. The air dielectric furnishes a low-k interlayer dielectric effective for lowering the line-to-line capacitance.

Figure 19:
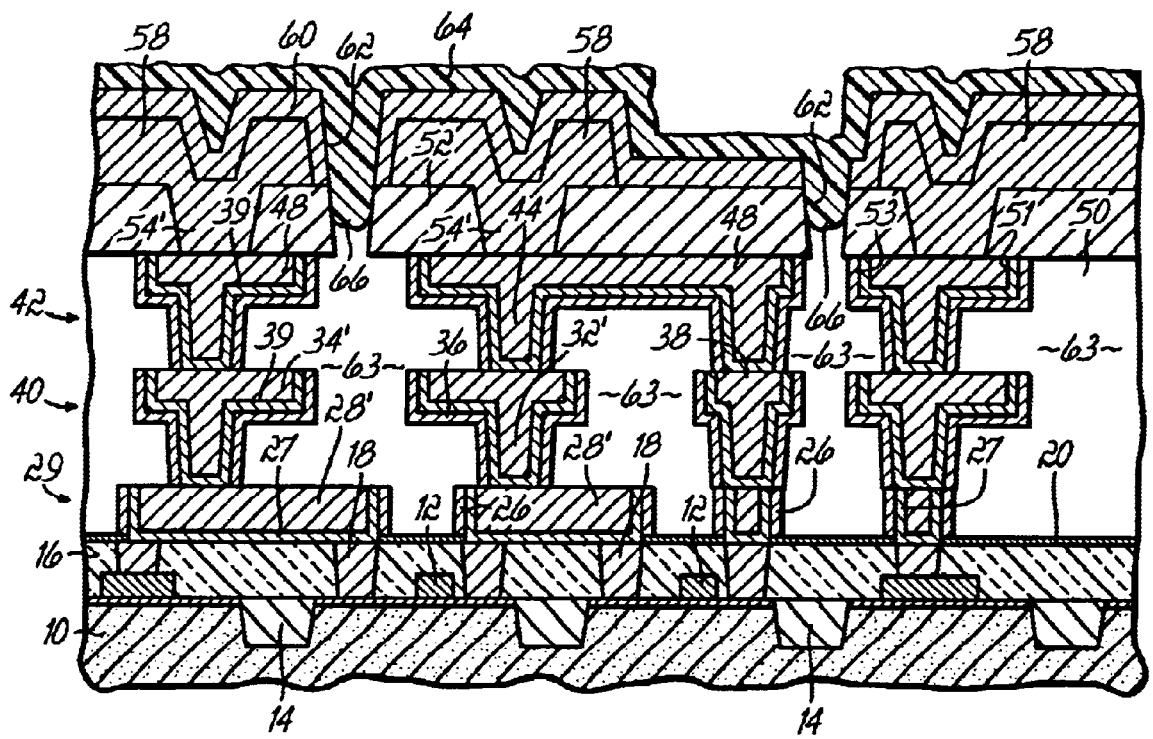

With reference to FIG. 19, an encapsulant 64 is deposited over the multilevel interconnect structure. The encapsulant 64 has portions 66 that fill and seal the passageways 62. In the uncured state, the viscosity of the encapsulant 64 should be sufficiently high so that the portions 66 fill the passageways but do not enter the air voids 63. The encapsulant 64 is exposed to open areas for pads (not shown) and then cured to a structurally stable form. An exemplary encapsulant 64 is polyimide having a thickness of several microns.

Thus, while the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for manufacturing a multi-level interconnect structure, comprising:
   applying a mandrel material to a substrate;
   removing portions of the mandrel material to form trenches;
   removing portions of the mandrel material to form vias, the trenches opening onto the underlying vias;
   filling the vias and the trenches with a conductive material to create a plurality of features having the mandrel material disposed between adjacent features;

forming at least one layer overlying the features and the mandrel material;

defining at least one passageway leading to the mandrel material through the layer; and removing the mandrel material by introducing an isotropic etchant into the passageway, the isotropic etchant selectively etching the mandrel material to leave an air void between adjacent features.

2. The method of claim 1 wherein the mandrel material is selected from the group consisting of amorphous silicon, amorphous germanium, and amorphous silicon-germanium.

3. The method of claim 2 wherein the mandrel material is amorphous silicon and the isotropic etchant contains potassium hydroxide.

4. The method of claim 2 wherein the mandrel material is amorphous germanium and the isotropic etchant contains hydrogen peroxide.

5. The method of claim 1 wherein removing portions of the mandrel material to form trenches is performed by a single lithographic and etch operation.

6. The method of claim 1 wherein removing portions of the mandrel material to form vias is performed by a single lithographic and etch operation.

7. The method of claim 1 wherein the multilevel interconnect structure is free of protective layers covering the mandrel material.

8. The method of claim 1 wherein the conductive material is copper.

9. The method of claim 8 wherein the isotropic etchant is capable of removing the mandrel material selective to copper.

10. The method of claim 9 wherein the isotropic etchant is capable of removing the mandrel material selective to titanium, titanium nitride, tantalum, tantalum nitride, silicon oxide, silicon nitride, and aluminum.

11. The method of claim 1 wherein filling the vias and the trenches with the conductive material further comprises introducing the conductive material into the vias and the trenches by a single deposition of the conductive material.

12. A method for manufacturing a multi-level interconnect structure, comprising:

forming a first layer of a mandrel material on a substrate;

removing portions of the first layer of the mandrel material to form first trenches;

removing portions of the first layer of the mandrel material to form first vias, the first trenches opening onto the underlying first vias;

filling the first vias and the first trenches with a conductive material to create a plurality of first features having the mandrel material horizontally separating adjacent first features;

forming a second layer of the mandrel material overlying the first features;

removing portions of the second layer of the mandrel material to form second trenches;

removing portions of the second layer of the mandrel material to form second vias, the second trenches opening onto the underlying second vias;

filling the second vias and the second trenches with the conductive material to create a plurality of second features having the mandrel material horizontally separating adjacent second features, the mandrel material separating the second features being coextensive with the mandrel material separating the first features;

forming at least one layer overlying the second features;

defining at least one passageway leading to the mandrel material through the layer; and removing the mandrel material by introducing an isotropic etchant into the passageway, the isotropic etchant selectively etching the mandrel material to leave an air void between adjacent first features and between adjacent second features.

13. The method of claim 12 wherein the mandrel material is selected from the group consisting of amorphous silicon, amorphous germanium, and amorphous silicon-germanium.

14. The method of claim 12 wherein the mandrel material is amorphous silicon and the isotropic etchant contains potassium hydroxide.

15. The method of claim 12 wherein the mandrel material is amorphous germanium and the isotropic etchant contains hydrogen peroxide.

16. The method of claim 12 wherein removing the mandrel material to form first trenches is performed by a single lithographic and etch operation.

17. The method of claim 12 wherein removing the mandrel material to form first vias is performed by a single lithographic and etch operation.

18. The method of claim 12 wherein removing the mandrel material to form second trenches is performed by a single lithographic and etch operation.

19. The method of claim 12 wherein removing the mandrel material to form second vias is performed by a single lithographic and etch operation.

20. The method of claim 12 wherein an interface between the mandrel material separating the second features and the mandrel material separating the first features is free of protective layers.

21. The method of claim 12 wherein the conductive material is copper.

22. The method of claim 21 wherein the isotropic etchant is capable of removing the mandrel material selective to copper.

23. The method of claim 22 wherein the isotropic etchant is capable of removing the mandrel material selective to titanium, titanium nitride, tantalum, tantalum nitride, silicon oxide, silicon nitride, and aluminum.

24. A method for manufacturing a multi-level interconnect structure, comprising:

applying a mandrel material to a substrate, the mandrel material being selected from the group consisting of amorphous silicon, amorphous germanium, and amorphous silicon-germanium;

removing portions of the mandrel material to form trenches;

removing portions of the mandrel material to form vias, the trenches opening onto the underlying vias;

filling the vias and the trenches simultaneously with a conductive material to create a plurality of features having the mandrel material disposed between adjacent features;

forming at least one layer overlying the features and the mandrel material;

defining at least one passageway leading to the mandrel material through the layer; and removing the mandrel material by introducing an isotropic etchant into the passageway, the isotropic etchant selectively etching the mandrel material to leave an air void between adjacent features.

25. The method of claim 24 wherein the mandrel material is amorphous silicon and the isotropic etchant contains potassium hydroxide.

26. The method of claim 24 wherein the mandrel material is amorphous germanium and the isotropic etchant contains hydrogen peroxide.

27. The method of claim 24 wherein removing portions of the mandrel material to form trenches is performed by a single lithographic and etch operation.

28. The method of claim 24 wherein removing portions of the mandrel material to form vias is performed by a single lithographic and etch operation.

29. The method of claim 24 wherein the multilevel interconnect structure is free of protective layers covering the mandrel material.

30. The method of claim 24 wherein the conductive material is copper.

31. The method of claim 30 wherein the isotropic etchant is capable of removing the mandrel material selective to copper.

32. The method of claim 31 wherein the isotropic etchant is capable of removing the mandrel material selective to titanium, titanium nitride, tantalum, tantalum nitride, silicon oxide, silicon nitride, and aluminum.

33. A multi-level interconnect structure produced by the process comprising:

applying a mandrel material to a substrate;

removing portions of the mandrel material to form trenches;

removing portions of the mandrel material to form vias, the trenches opening onto the underlying vias;

filling the vias and the trenches with a conductive material to create a plurality of features having the mandrel material disposed between adjacent features;

forming at least one layer overlying the features and the mandrel material;

defining at least one passageway leading to the mandrel material through the layer; and removing the mandrel material by introducing an isotropic etchant into the passageway, the isotropic etchant selectively etching the mandrel material to leave an air void between adjacent features.

34. The multi-level interconnect structure of claim 33 wherein the conductive material is copper.

35. The multi-level interconnect structure of claim 34 wherein the isotropic etchant is capable of removing the mandrel material selective to copper.

36. The multi-level interconnect structure of claim 35 wherein the isotropic etchant is capable of removing the mandrel material selective to titanium, titanium nitride, tantalum, tantalum nitride, silicon oxide, silicon nitride, and aluminum.

37. The multi-level interconnect structure of claim 33 wherein the mandrel material is selected from the group consisting of amorphous silicon, amorphous germanium, and amorphous silicon-germanium.

38. The multi-level interconnect structure of claim 37 wherein the mandrel material is selected from the group consisting of amorphous silicon, amorphous germanium, and amorphous silicon-germanium.

39. The multi-level interconnect structure of claim 37 wherein the mandrel material is amorphous silicon and the isotropic etchant contains potassium hydroxide.

* * * * *